(12) United States Patent
Bhatia et al.

(10) Patent No.: US 9,324,386 B2
(45) Date of Patent: Apr. 26, 2016

(54) WIDE COMMON MODE RANGE SENSE AMPLIFIER

(71) Applicant: Apple Inc., Cupertino, CA (US)

(72) Inventors: Ajay Kumar Bhatia, Saratoga, CA (US); Amrinder S Barn, San Jose, CA (US)

(73) Assignee: Apple Inc., Cupertino, CA (US)

( * ) Notice: Subject to any disclaimer, the term of this patent is extended or adjusted under 35 U.S.C. 154(b) by 153 days.

(21) Appl. No.: 14/158,231

(22) Filed: Jan. 17, 2014

(65) Prior Publication Data

US 2015/0207462 A1    Jul. 23, 2015

(51) Int. Cl.
*G01R 19/00* (2006.01)
*G11C 7/10* (2006.01)
*G11C 7/02* (2006.01)
*G11C 7/06* (2006.01)
*G11C 7/08* (2006.01)

(52) U.S. Cl.
CPC .............. *G11C 7/1051* (2013.01); *G11C 7/02* (2013.01); *G11C 7/065* (2013.01); *G11C 7/08* (2013.01); *G11C 7/1048* (2013.01)

(58) Field of Classification Search
CPC ..... G11C 7/1051; G11C 7/106; G11C 7/1084; G11C 27/02; H04L 25/0272
See application file for complete search history.

(56) References Cited

U.S. PATENT DOCUMENTS

| | | | |
|---|---|---|---|
| 6,977,532 B2 * | 12/2005 | Ta et al. | 327/63 |
| 7,304,525 B2 | 12/2007 | Nuebling | |
| 7,602,244 B1 * | 10/2009 | Holmes et al. | 330/149 |
| 8,189,403 B2 | 5/2012 | Sohn et al. | |
| 8,199,859 B2 | 6/2012 | Zerbe et al. | |
| 8,471,635 B2 | 6/2013 | Jurasek et al. | |
| 2007/0115031 A1 * | 5/2007 | Hsu et al. | 327/52 |

* cited by examiner

*Primary Examiner* — Sibin Chen
(74) *Attorney, Agent, or Firm* — Meyertons, Hood, Kivlin, Kowert & Goetzel, P.C.

(57) ABSTRACT

A device for comparing voltage levels of a pair of input signals is presented. The device may include a pre-amp circuit and a differential amplifier. The pre-amp circuit may be configured to receive a first input signal and a second input signal, adjust a voltage level of each of the pair of input signals, and assert a control signal after a pre-determined period of time from the assertion of an enable signal. The differential amplifier may be configured to amplify a voltage difference between the first input signal and the second input signal dependent upon the adjusted voltage level of the pair of input signals in response to the assertion of the control signal.

20 Claims, 6 Drawing Sheets

WIDE COMMON MODE RANGE SENSE AMPLIFIER

BACKGROUND

1. Technical Field

This invention is related to the field of integrated circuit implementation, and more particularly to the implementation of differential amplifier circuits.

2. Description of the Related Art

Computing systems may include one or more systems on a chip (SoC), which may integrate a number of different functions, such as graphics processing or audio processing, onto a single integrated circuit. With numerous functions included in a single integrated circuit, chip count may be kept low in mobile computing systems, such as tablets, for example, which may result in reduced assembly costs, and a smaller form factor for such mobile computing systems.

Extending battery life in these mobile computing systems continues to be a key goal for the manufacturers of these devices. One method for extending battery life is to reduce the internal operating voltage level of the SoCs. Reducing the operating voltage level may reduce the average power consumed by the SoC.

A drawback to reducing the operating voltage level of the SoCs is that differential signals used within many SoCs may be difficult to read. Differential signals are generally implemented as a pair of signals. The value of a data bit may be encoded as a difference between the voltage levels of each of the signals. To recover encoded data, a difference between the voltage levels of the signals may be amplified, and the value of the encoded data bit determined dependent upon the amplified difference. An advantage of differential signals may be that since the signals are measured against one another rather than measured against a set voltage threshold, smaller voltage swings between high and low values may be used. Smaller voltage swings may save power and/or allow for higher bit rates. Another advantage may be that differential signal may be more tolerant to supply noise if the supply noise is common to both signals in the pair of signals.

Differential amplifiers may be used to measure and read differential signals. However, some designs for differential amplifiers may have limited common mode input voltage ranges. A common mode voltage may refer to an average voltage level for a differential signal pair. In other words, a given differential signal pair may have a common mode voltage level of $V_{CM}$ such that the high signal may be $V_{CM}+30$ mV and the low signal may be $V_{CM}-30$ mV. As an example of a limited bandwidth design, a known differential amplifier may only be capable of reading inputs with common mode voltages in the range of 0.3V to the operating voltage of the circuit. As the input signals approach a common mode voltage level of 0.3V, the differential amplifier may have more trouble resolving the bit values to reach a result. As a result, the amplifier may take longer to resolve the bit values and at a certain point, may not be capable of reaching a result which may cause data transmission errors and potentially failure of the system at a desired frequency of operation. As operating voltages are reduced to conserve power, the input bandwidth of traditional differential amplifier designs may be reduced.

Therefore, a new differential amplifier design is desired to extend the input bandwidth to allow for lower operating voltages. However, the new design must be power efficient so that power savings from lowering the operating voltage are not negated by increased power consumption of the differential amplifier.

SUMMARY OF THE EMBODIMENTS

Various embodiments of a differential amplifier are disclosed. Broadly speaking, an apparatus, a system and a method are contemplated in which the apparatus includes a pre-amp circuit and a differential amplifier. The pre-amp circuit may be configured to receive a first input signal and a second input signal, adjust a voltage level of the first input signal and the second input signal, and assert a control signal after a pre-determined period of time from the assertion of an enable signal. The differential amplifier may be configured to amplify a voltage difference between the first input signal and the second input signal dependent upon the adjusted voltage level of the first input signal and the adjusted voltage level of the second input signal in response to the assertion of the control signal. At least one output signal may be generated by the differential amplifier dependent upon the amplified voltage difference between the first input signal and the second input signal.

A further embodiment of the apparatus may include an inverting output stage. The inverting output stage may be configured to invert outputs of the differential amplifier and buffer these outputs. In another embodiment of the apparatus, the second input signal may be complementary to the first input signal, such that when a voltage level of the first input signal increases, the voltage level of the second input signal decreases by a corresponding amount and vice versa.

In one embodiment of the apparatus, the pre-amp circuit may include a first pull-up device on the first input signal and a second pull-up device on the second input signal to enhance sensing of a voltage difference between the first input signal and the second input signal. In a further embodiment of the apparatus, the first pull-up device may be controlled by the second input signal and the second pull-up device may be controlled by the first input signal.

In another embodiment of the apparatus, the pre-amp circuit may be further configured to disable the first pull-up device and the second pull-up device in response to a de-assertion of the enable signal.

BRIEF DESCRIPTION OF THE DRAWINGS

The following detailed description makes reference to the accompanying drawings, which are now briefly described.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph six interpretation for that unit/circuit/component. More generally, the recitation of any element is expressly intended not to invoke 35 U.S.C. § 112, paragraph six interpretation for that element unless the language "means for" or "step for" is specifically recited.

DETAILED DESCRIPTION OF EMBODIMENTS

A system-on-a-chip (SoC) may include one or more functional blocks, such as, e.g., memories and power supplies, which may integrate the function of a computing system onto a single integrated circuit. Since an SoC may integrate multiple features into a single circuit, they are a popular choice for portable devices where space for components is limited.

To reduce power consumption in some portable devices, manufacturers may reduce the operating voltage of the device or of components within the devices. Therefore new SoC designs may be required to operate at lower voltage levels than previous designs. Additionally, other performance criteria may remain constant or increase for new products. To satisfy the lower operating voltage requirements and higher performance targets, circuits within the SoC may need to be modified or redesigned. Predominantly digital circuits may require no design changes, but instead a change in manufacturing process technology may accomplish the desired results. Analog circuits, however, may require design changes, particularly if the manufacturing process technology is changed for the digital circuits. Differential amplifiers are one such analog circuit that may require changes to meet new power and performance targets.

Differential amplifiers may be used to measure and read differential signals. Differential signals may be implemented as a pair of signals in which the value of a data bit may be encoded as a difference between the voltage levels of each of the signals. By using a differential amplifier to read a pair of differential signals, the voltage level difference between the pair of differential signals may be reduced since the signals may be compared to each other rather than compared to a common reference voltage such as a ground reference. Since the differential signals may have smaller voltage level swings when switching from a "high" or "logic 1" state to a "low" or "logic 0" state, and vice versa, each signal may have a common voltage level offset, commonly referred to as a common mode voltage, equal to the average voltage level of the pair of differential signals.

A challenge for differential amplifiers is to perform consistently over a wide range of common mode input voltages. Some differential amplifier designs may perform well over a limited input voltage range, but then have slow response times or even fail to resolve an output when the levels of the common mode voltage of the inputs reach the limits of the input voltage range. In respect to differential amplifiers, resolving an output may refer to the differential amplifier's ability to produce an output that accurately represents the state of the inputs. Reducing the operating voltage of a differential amplifier may narrow the limits of the input voltage range. Therefore, a differential amplifier design that performs consistently over a wide range of common mode input voltages is desired. Such designs must not consume significantly more power than known solutions, however, since reducing overall power consumption may be a key goal of the SoC.

Various embodiments of a differential amplifier are described in this disclosure. The embodiments illustrated in the drawings and described below may provide techniques for providing wide common mode input ranges while simultaneously operating in a power efficient manner.

Terminology Summary

Many terms commonly used in reference to SoC designs are used in this disclosure. For the sake of clarity, the intended definitions of some of these terms, unless stated otherwise, are as follows.

A Metal-Oxide-Semiconductor Field-Effect Transistor (MOSFET) describes a type of transistor that may be used in modern digital logic designs. MOSFETs are designed as one of two basic types, n-channel and p-channel. N-channel MOSFETs open a conductive path between the source and drain when a positive voltage greater than the transistor's threshold voltage is applied between the gate and the source. P-channel MOSFETs open a conductive path when a voltage greater than the transistor's threshold voltage is applied between the drain and the gate.

Complementary MOSFET (CMOS) describes a circuit designed with a mix of n-channel and p-channel MOSFETs. In CMOS designs, n-channel and p-channel MOSFETs may be arranged such that a high level on the gate of a MOSFET turns an re-channel transistor on, i.e., opens a conductive path, and turns a p-channel MOSFET off, i.e., closes a conductive path. Conversely, a low level on the gate of a MOSFET turns a p-channel on and an n-channel off. While CMOS logic is used in the examples described herein, it is noted that any suitable logic process may be used for the circuits described in embodiments described herein.

It is noted that "logic 1", "high", "high state", or "high level" refers to a voltage sufficiently large to turn on a n-channel MOSFET and turn off a p-channel MOSFET, while "logic 0", "low", "low state", or "low level" refers to a voltage that is sufficiently small enough to do the opposite. In other embodiments, different technology may result in different voltage levels for "low" and "high."

The embodiments illustrated and described herein may employ CMOS circuits. In various other embodiments, however, other suitable technologies may be employed.

System-on-a-Chip Overview

Figure 1:
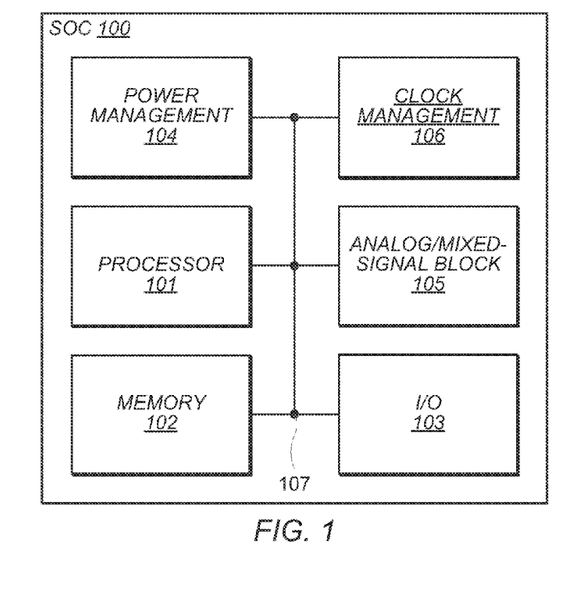
FIG. 1 illustrates an embodiment of a system-on-a-chip.

A block diagram of an embodiment of an SoC is illustrated in FIG. 1. In the illustrated embodiment, the SoC 100 includes a processor 101 coupled to memory block 102, I/O block 103, power management unit 104, analog/mixed-signal block 105, and clock management unit 106, all coupled through bus 107. In various embodiments, SoC 100 may be configured for use in a mobile computing application such as, e.g., a tablet computer or cellular telephone.

Processor 101 may, in various embodiments, be representative of a general-purpose processor that performs computational operations. For example, processor 101 may be a central processing unit (CPU) such as a microprocessor, a microcontroller, an application-specific integrated circuit (ASIC), or a field-programmable gate array (FPGA). In some embodiments, processor 101 may include multiple CPU cores and may include one or more register files and memories.

In various embodiments, processor 101 may implement any suitable instruction set architecture (ISA), such as, e.g., PowerPC™, or x86 ISAs, or combination thereof. Processor 101 may include one or more bus transceiver units that allow processor 101 to communicate to other functional blocks within SoC 100 such as, memory block 102, for example.

Memory block 102 may include any suitable type of memory such as, for example, a Dynamic Random Access Memory (DRAM), a Static Random Access Memory (SRAM), a Read-only Memory (ROM), Electrically Erasable Programmable Read-only Memory (EEPROM), a FLASH memory, a Ferroelectric Random Access Memory (FeRAM), or a Magnetoresistive Random Access Memory (MRAM), for example. Some memory types may use a differential amplifier to read, or sense, bit values within the memory array. Some embodiments may include a single memory, such as memory block 102 and other embodiments may include more than two memory blocks (not shown). In some embodiments, memory block 102 may be configured to store program instructions that may be executed by processor 101. Memory block 102 may, in other embodiments, be configured to store data to be processed, such as graphics data, for example.

Memory block 102 may, in some embodiments, include an external memory interface to access memory that does not reside within SoC 100. For example, memory 102 may include a DRAM interface or flash interface to access DRAM or flash memory die that are coupled to the SoC off-die. A DRAM or flash interface may provide a higher speed connection for processor 101 to access the memories and may utilize differentially encoded signals to transfer data. Data encoded and transmitted in such a fashion may be reconstructed at a receiving device using various techniques and circuits, such as a differential amplifier, for example.

I/O block 103 may be configured to coordinate data transfer between SoC 100 and one or more peripheral devices. Such peripheral devices may include, without limitation, storage devices (e.g., magnetic or optical media-based storage devices including hard drives, tape drives, CD drives, DVD drives, etc.), audio processing subsystems, graphics processing subsystems, or any other suitable type of peripheral devices. In some embodiments, I/O block 103 may be configured to implement a version of USB protocol, IEEE 1394 (Firewire®) protocol, or, and may allow for program code and/or program instructions to be transferred from a peripheral storage device for execution by processor 101. In one embodiment, I/O block 103 may be configured to perform the data processing necessary to implement an Ethernet (IEEE 802.3) networking standard.

Power management unit 104 may be configured to manage power delivery to some or all of the functional blocks included in SoC 100. Power management unit 104 may comprise sub-blocks for managing multiple power supplies for various functional blocks. In various embodiments, the power supplies may be located in analog/mixed-signal block 105, in power management unit 104, in other blocks within SoC 100, or come from external to SoC 100, coupled through power supply pins. Power management unit 104 may include one or more voltage regulators to adjust outputs of the power supplies to various voltage levels as required by functional blocks within SoC 100.

Analog/mixed-signal block 105 may include a variety of circuits including, for example, a crystal oscillator, a phase-locked loop (PLL) or frequency-locked loop (FLL), an analog-to-digital converter (ADC), and a digital-to-analog converter (DAC) (all not shown). In some embodiments, analog/mixed-signal block 105 may also include, in some embodiments, radio frequency (RF) circuits that may be configured for operation with cellular telephone or other wireless networks. Analog/mixed-signal block 105 may include one or more voltage regulators to supply one or more voltages to various functional blocks and circuits within those blocks.

Clock management unit 106 may be configured to select one or more clock sources for the functional blocks in SoC 100. Each function block within SoC 100 may, in some embodiments, operate using clock sources with differing frequencies. In various embodiments, the clock sources may be located in analog/mixed-signal block 105, in clock management unit 106, in other blocks with SoC 100, or come from external to SoC 100, coupled through one or more I/O pins. In some embodiments, clock management 106 may be capable of dividing a selected clock source before it is distributed throughout SoC 100. Clock management unit 106 may include registers for selecting an output frequency of a PLL, FLL, or other type of adjustable clock source. In such embodiments, clock management unit 106 may manage the configuration of one or more adjustable clock sources and may be capable of changing clock output frequencies in stages in order to avoid a large change in frequency in a short period of time.

System bus 107 may be configured as one or more buses to couple processor 101 to the other functional blocks within the SoC 100 such as, e.g., memory block 102, and I/O block 103. In some embodiments, system bus 107 may include interfaces coupled to one or more of the functional blocks that allow a particular functional block to communicate through the bus. In further embodiments, system bus 107 may allow movement of data and transactions (i.e., requests and responses) between functional blocks without intervention from processor 101. For example, data received through the I/O block 103 may be stored directly to memory block 102.

In some embodiments, system bus 107 may include one or more high-speed buses to link two or more functional blocks. Such a high-speed bus may, in some embodiments, transmit data in a serial fashion rather than a parallel fashion, such as, e.g., the transmission of 8-bits, 16-bits, or 32-bits in parallel. Serial transmission schemes may, in various embodiments, reduce Electro-Magnetic Interference (EMI). In some embodiments, a high-speed serial design may include a pair of signals to transport differentially encoded data.

It is noted that the SoC illustrated in FIG. 1 is merely an example. In other embodiments, different functional blocks and different configurations of functions blocks may be possible.

Differential Amplifier Overview

Figure 2:
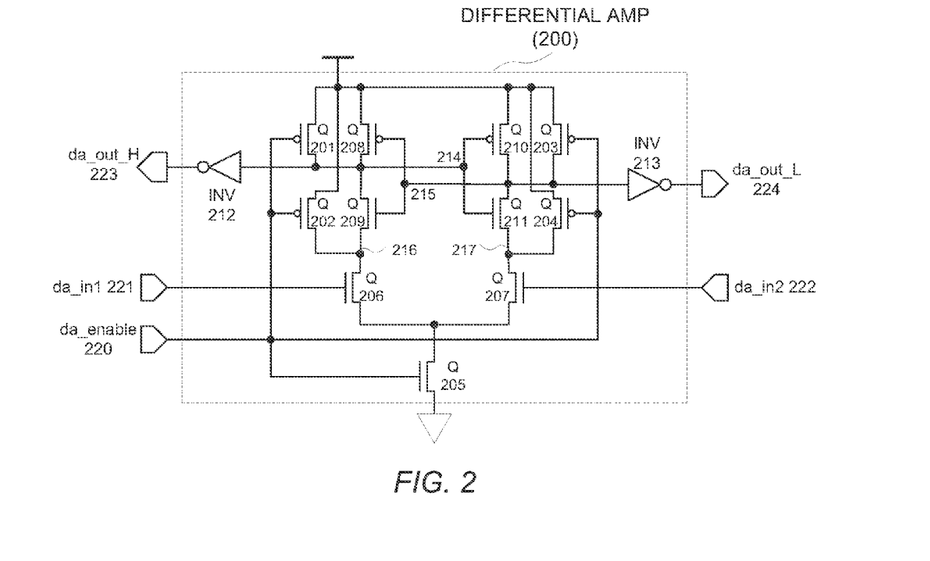
FIG. 2 illustrates an embodiment of a differential amplifier circuit.

Turning to FIG. 2, an embodiment of a differential amplifier (also referred to herein as a "differential amp" or "diff amp") is illustrated. In some embodiments, differential amp 200 may be included in a high-speed serial interface such as may be included in memory 102 or system bus 107. In the illustrated embodiment, differential amp 200 receives signals da_enable 220, da_in1 221, and da_in2 222 as inputs from other parts of the system. Da_in1 221 and da_in2 222 are coupled to transistors Q206 and Q207, respectively. Da_enable 220 is coupled to transistors Q201-Q205. Differential amp 200 includes two outputs, da_out_H 223 and da_out_L 224 which are coupled to the outputs of inverters INV 212 and INV 213, respectively.

It is noted that CMOS inverters, such as those shown and described herein, may be particular embodiments of inverting amplifiers that may be employed in the circuits described herein. In other embodiments, however, any suitable configuration of inverting amplifier that is capable of inverting the logical sense of a signal(s) and performing logical work may be employed including inverting amplifiers built using technology other than CMOS.

During operation, differential amp 200 is enabled and disabled by the input signal da_enable 220, which controls transistors Q201-Q205. Da_enable 220 may be generated by a clock source, such as a clock used as a timing reference for a high-speed interface, or a clock used when reading a memory array. In some embodiments, the clock source may operate continuously while SoC 100 is active and, in other embodiments, the clock source may operate for a short duration as needed to operate differential amp 200. Differential amp 200 may be disabled when da_enable 220 is low. In this state, Q201-Q204 will conduct, thereby pre-charging nodes 214-217 to the power supply voltage. Nodes 214 and 215 are the inputs to inverters INV 212 and INV 213. Therefore, when the nodes charge to a high state, outputs da_out_H 223 and da_out_L 224 may be driven to low states. Q205 will not conduct with a low input from da_enable 220, so the path to ground is disabled, regardless of the da_in2 222 and da_in1 221 inputs on Q206 and Q207 respectively.

It is noted that although pre-charge devices, feedback devices, pull-up devices, and pull-down devices may be illustrated as individual transistors, in other embodiments, any of these devices may be implemented using multiple transistors or other suitable circuit elements.

As described herein, a pull-up device and a pull-down device may couple a node in a circuit to a power supply or to ground, respectively. A pull-up device (also referred to as a "pull-up") may create a path to power supply in order to increase or "pull" the voltage level of the node towards a higher voltage level of the power supply. Conversely, a pull-down device (also referred to as a "pull-down") may create a path to ground or to another power supply with a lower voltage level than the node such that the voltage level of the node is decreased or "pulled" to the lower voltage level. A node may be coupled to both an active pull-up and an active pull-down simultaneously. In such cases, the voltage level of the node may depend on the relative resistance values of the pull-up device and the pull-down device.

In response to da_enable 220 transitioning to a high state, Q201-Q204 stop conducting and Q205 starts conducting, thereby establishing a path to ground. Now the comparison of da_in2 222 to da_in1 221 begins. If da_in2 222 less than da_in1 221, then node 216 will be pulled to ground faster than node 217, which results in Q209 conducting before Q211. This, in turn, pulls node 214 to ground which causes Q210 to conduct and Q211 to stop conducting which keeps node 215 pulled to the power supply voltage. The differential amp will stabilize with da_out_H 223 transitioning to a high state and da_out_224 remaining in a low state. If da_in2 222 is greater than da_in1 221, the opposite will occur, and da_out_H 223 will remain in a low state and da_out_224 will transition to a high state.

Differential amp 200 may perform adequately as long as input signals da_in1 221 and da_in2 222 have a common mode voltage level well above zero volts. However, since Q206 and Q207 are both n-channel transistors, as the common mode voltage level approaches zero volts, the time required for differential amp 200 to reach a result may increase, and in some cases, differential amplifier 200 may fail to reach a result. N-channel transistors may be more sensitive to voltages near the operating voltage and less sensitive to voltages near zero volts, and as such, differential amp 200 may have a limited input bandwidth.

It is noted that in the embodiment of FIG. 2, transistors Q206 and Q207 are depicted as n-channel MOSFETs. In other embodiments, however, any suitable transconductance device may be employed, such as, e.g., bipolar transistors, Junction Field Effect Transistors (JFETs), and the like.

It is noted that the embodiment illustrated in FIG. 2 is merely an example of a differential amplifier. In other embodiments, various other circuit topologies may be employed.

Figure 3:
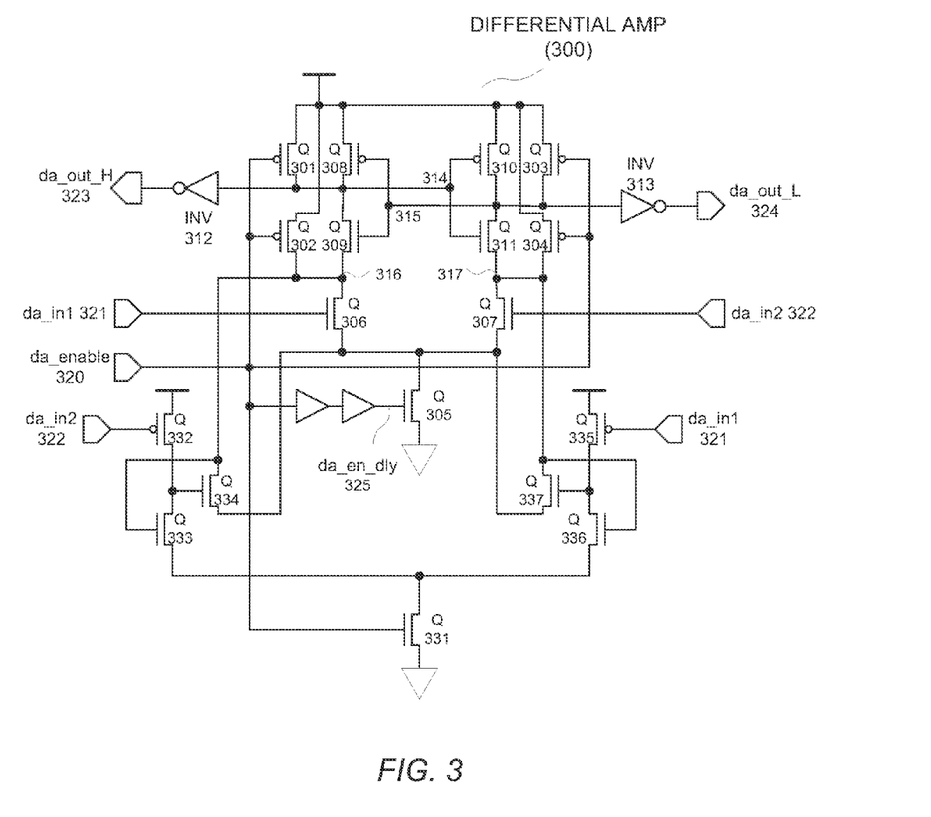
FIG. 3 illustrates another embodiment of a differential amplifier circuit.

Turning to FIG. 3, another embodiment of a differential amplifier is illustrated. In the illustrated embodiment, differential amp 300 includes transistors Q331 through Q337 in additional to other circuit elements similar to differential amp 200 as depicted in FIG. 2. Transistors Q331 through Q337 may form a pre-amplification (commonly referred to as a "pre-amp") circuit for input signals da_in1 221 and da_in2 222. Transistors Q332, Q333 and Q334 are arranged as a pre-amp in parallel with Q306 and transistors Q335, Q336, and Q337 are arranged as a pre-amp in parallel with Q307.

It is noted that Q306 is coupled to da_in1 321 while the associated pre-amp is coupled to da_in2 322 and vice versa for Q307 and its associated pre-amp. The inputs to the pre-amps are coupled to Q332 and Q335, both of which are p-channel transistors. As mentioned above, n-channel transistors may be more sensitive to input voltage levels near the operating voltage. Conversely, p-channel transistors may be more sensitive to voltage levels near 0 volts. Therefore, in the case where da_in1 321 greater than da_in2 322, both Q306 and Q332 may conduct more than Q307 and Q335, which may result in node 316 being pulled low faster than node 317.

In the operation of differential amp 300, Q305 may be turned on by da_en_dly 325, which may be a delayed version of da_enable 320. Q305 may enable the main comparison circuit of differential amp 300. The delay may provide some time for the two pre-amps to react to their respective input signals before differential amp 300 is fully enabled.

During operation, differential amp 300 is enabled and disabled by input signal da_enable 320, which controls transistors Q301-Q304 and Q331. A delayed version of da_enable 320 also controls Q305, as mentioned above, to provide time for the two pre-amps to react. Differential amp 300 may be disabled when da_enable 320 is low. In this state, Q301-Q304 will conduct, thereby pre-charging nodes 314 and 315 to the operating voltage. Nodes 314 and 315 are the input to inverters INV 312 and INV 313, which drive outputs da_out_H 323 and da_out_324 both to low states, respectively. Nodes 316 and 317 are also pre-charged to the operating voltage. Q331 will not conduct with a low input from da_enable 320, so the path to ground is disabled. Likewise, Q305 will not conduct with a low input from da_en_dly 325.

The source for da_enable 320, similar to da_enable 220, may be generated by a clock source, such as, a clock used as a timing reference for a high-speed interface, or a clock employed to access a memory array. Da_enable 320 may be a clock signal that operates continuously while SoC 100 is operational or da_enable 320 may be pulsed high and low as needed to enable and disable operation of differential amp 300. Da_enable may be a stable duty cycle or the duty cycle may vary within the tolerances of differential amp 300. In some embodiments, da_enable 320 may be pulsed with a minimum high level duration to save power by keeping differential amp 300 disabled for longer durations.

As described above in regards to FIG. 2, pre-charge devices, feedback devices, pull-up devices, and pull-down devices may be depicted as individual devices. In other embodiments, however, any of these devices may be implemented using multiple transistors or other suitable circuit elements.

In response to da_enable 320 transitioning to a high state, Q301-Q304 stop conducting and Q331 starts conducting, thereby opening a path to ground for the two pre-amp circuits. Since input signals da_in1 321 and da_in2 322 are coupled directly to p-channel transistors Q335 and Q332, respectively, the input signal with the lower voltage will cause the associated transistor to pull to the operational voltage level faster. However, since nodes 316 and 317 have been pre-charged to the operational voltage level, transistors Q333 and Q336 will conduct, thereby countering the pull-ups of Q332 and Q335. If the common mode voltage level of the input signals is high, the p-channel transistors, Q332 and Q335 will not turn on strong enough to challenge Q333 and Q336 respectively. However, if the common mode voltage level of the inputs is low, then Q332 and Q335 may conduct sufficient current to challenge Q333 and Q336 and cause Q334 and Q337, respectively, to conduct.

After a brief delay from da_enable 320 transitioning high, da_en_dly 325 will transition to a high state which will cause Q305 to begin conducting, opening a path to ground for Q306, Q307, Q334, and Q337. If da_in2 322 is less than da_in1 321, then node 316 will be pulled to ground faster than node 317, which results in Q309 conducting before Q311. This, in turn, discharges node 314 to ground which causes Q310 to conduct and Q311 to stop conducting which keeps node 315 pulled to the power supply voltage. The differential amp will stabilize with da_out_H 323 transitioning to a high state and da_out_L 324 remaining in a low state. If da_in2 322 is greater than da_in1 321, the opposite will occur and da_out_H 323 will remain in a low state and da_out_324 will transition to a high state.

In some embodiments, the addition of pre-amp circuits may allow differential amp 300 to perform over a wide range of common mode voltage levels of the inputs. If the common mode voltage level is high, then the n-channel input transistors, Q306 and Q307, may conduct better than the p-channel input transistors, Q332 and Q335, and therefore the n-channel transistors may determine the result while the p-channel transistors have negligible impact on the result. If the common mode voltage level is near the middle of the operational voltage range (i.e., one half of the operational voltage level), then differential amplifier 300 may reach a result faster than if the pre-amp circuits were omitted, since both the n-channel and p-channel input transistors may both contribute and work in parallel. If the common mode voltage level is near 0 volts, differential amplifier 300 may still operate since to the p-channel input transistors (Q332 and Q335) in the pre-amps may sense the low voltage levels, while the n-channel input transistors may have negligible impact on the result.

It is noted that transistor Q331 will only conduct when da_enable 320 is high. When da_enable 320 is low, differential amplifier 300 is disabled and the pre-amps will not have a path to ground and therefore may consume little to no significant power. Therefore, the pre-amp circuits may increase the input bandwidth of differential amp 300 with negligible impact to overall power consumption.

It is also noted that in the embodiment of FIG. 3, transistors Q306 and Q307 are depicted as n-channel MOSFETs and transistors Q332 and Q335 are depicted as p-channel MOSFETs. In other embodiments, however, any suitable transconductance technology capable of implementing logic circuits may be employed including bi-polar transistor technology.

It is further noted that, FIG. 3 is merely an example of a differential amplifier circuit. In other embodiments, various other circuits may be employed as differential amplifiers.

Figure 4:
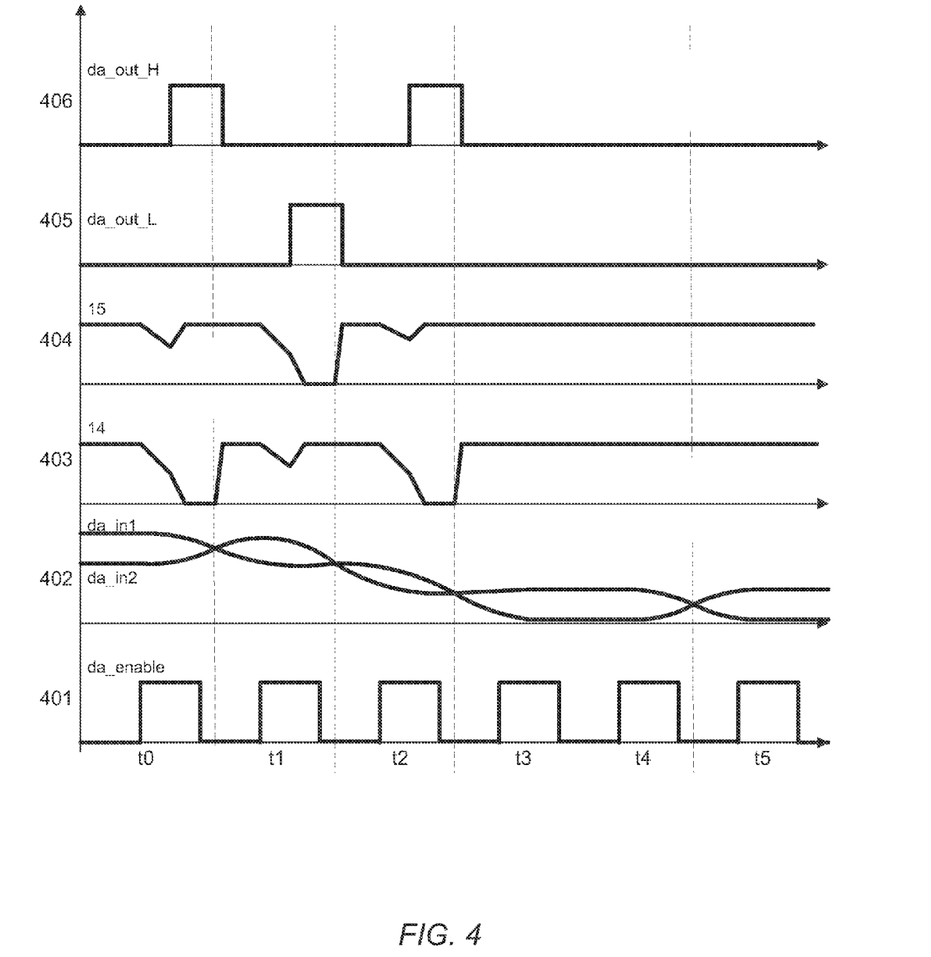
FIG. 4 illustrates possible waveforms for the differential amplifier of FIG. 2.

FIG. 4 illustrates a chart of possible waveforms associated with the operation of a differential amplifier such as, e.g., differential amp 200 as illustrated in FIG. 2, as the amplifier reads a string of values from a pair of differential inputs. Referring collectively to differential amp 200 in FIG. 2 and the chart in FIG. 4, the first waveform on the bottom of the chart, 401, shows a periodic signal called da_enable. Da_enable may correspond to da_enable 220. Waveform 402 shows an example of a possible differential pair of input signals labeled da_in1 and da_in2, which may correspond to da_in1 221 and da_in2 222. Waveform 403, labeled 14, and waveform 404, labeled 15, may correspond to signals at nodes 214 and 215. Waveforms 405 and 406 show possible waveforms for outputs, da1_out_L and da1_out_H, of a differential amplifier, such as differential amp 200, and may correspond to da_out_L 224 and da_out_H 223, respectively.

Referring to time period t0, the differential amplifier begins the period disabled, with input da_in1 is greater than da_in2 and with a higher common mode input voltage. When da_enable asserts near the middle of the period, the voltage levels on both nodes 14 and 15 start to drop in response to the pre-charge transistors (e.g., Q201 and Q203) being turned off as da_enable is asserted. In differential amp 200, Q205 may turn on creating a path to ground for Q206 and Q207. Q209 and Q211 conduct due to nodes 214 and 215 both being pre-charged to high levels. Since the voltage level of da_in1 is higher than that of da_in2, Q206 may conduct better than Q207 resulting in node 214 being pulled to ground before node 215. As the voltage level of node 214 approaches ground, Q210 starts to conduct and Q211 stops conducting. As a result, node 215 is pulled back high. Nodes 214 and 215 stabilize in these states as long as da_enable is asserted and output da_out_H goes high and da_out_goes low.

Towards the end of period t0, da_enable de-asserts, disabling the differential amplifier and the pre-charge transistors to begin charging nodes 14 and 15 back high. These nodes may not reach a high voltage until the next time period begins. The differential amplifier outputs may return to low values as a result of nodes 14 and 15 charging.

Moving to time period t1, when da_enable asserts, the common mode voltage level of the inputs is about the same as in period t0, except that this time da_in2 is greater than da_in1. The process will be similar to the description for time period t0, except since da_in2 is greater than da_in1, Q207 may conduct better than Q206 and as a result da_out_will go high and da_out_H will go low.

Once again, da_enable may de-assert near the end of the time period and the pre-charging for the next time period may start. The differential amplifier outputs may again return to low values as nodes 14 and 15 charge.

In time period t2, the common mode voltage level of the input signals may be close to the middle of the input voltage range (e.g., one half of the operating voltage) lower than in time periods t0 and t1. The lower common mode input levels may be due to a change in the source of the input signals, a change in the power supply of the system, electro-magnetic noise in the system, or other reasons. For the purpose of illustration, FIG. 4 depicts the change in common mode input levels occurring in two time periods. In various embodiments, the common mode voltage level of the inputs may change in the course of a single measurement or over the course of millions of measurements.

In time period t2, input da_in1 is greater than da_in2 again. The process to resolve a result is similar to what occurs in time period t0. Q205 may turn on creating a path to ground for Q206 and Q207. Q209 and Q211 will conduct due to nodes 214 and 215 both being pre-charged to high levels. Since the voltage level of da_in1 is higher than that of da_in2, Q206 may conduct better than Q207 resulting in node 214 being pulled to ground before node 215. Nodes 214 and 215 will stabilize in these states as long as da_enable is asserted and output da_out_H will go high and da_out_ will go low. Since the common mode voltage level of the inputs is lower, the time for differential amp 200 to resolve the result may be longer than in time period t0.

Towards the end of period t2, da_enable again de-asserts. The differential amplifier may be disabled and the pre-charge transistors start charging nodes 14 and 15. The differential amplifier outputs may again return to low values as a result of nodes 14 and 15 charging.

Turning to time period t3, the common mode voltage level of the inputs is has fallen close to ground. This time da_in2 is greater than da_in1. As described above, the lower common mode input levels may be due to a variety of reasons. In some embodiments, the low common mode voltage levels may affect the performance of differential amp 200. Due to the low input voltage levels, neither Q206 nor Q207 may receive high enough voltage levels to turn on to sufficiently conduct. As a result, both nodes 214 and 215 may remain high, and consequently outputs, da_out_H and da_out_ may both remain low. In other words, differential amp 200 may fail to resolve a result.

Towards the end of period t3, da_enable again de-asserts. The differential amplifier may be disabled and the pre-charge transistors start charging nodes 14 and 15. Since neither Q206 nor Q207 were able to conduct, neither node 14 nor node 15 may have discharged, so these nodes may see no significant change in voltage level. The differential amplifier outputs may remain at low values since nodes 14 and 15 may not have changed significantly.

In time period t4, the input voltage levels remain the same as in time period t3. Differential amp 200 may behave the same as in t3. In time period t5, the common mode input voltage level may remain low, but now da_in1>da_in2. For differential amp 200, this may result in a similar failure to resolve a result as in time periods t3 and t4.

It is noted that FIG. 4 is merely an example of waveforms that may result from the example embodiments as presented in this disclosure. The waveforms have been simplified for demonstrative purposes. Actual waveforms may differ due to components used to implement the disclosed circuits, environmental electro-magnetic noise, power supplies used, etc. Use of alternate circuit embodiments may also result in variations to the waveforms presented in FIG. 4.

Figure 5:
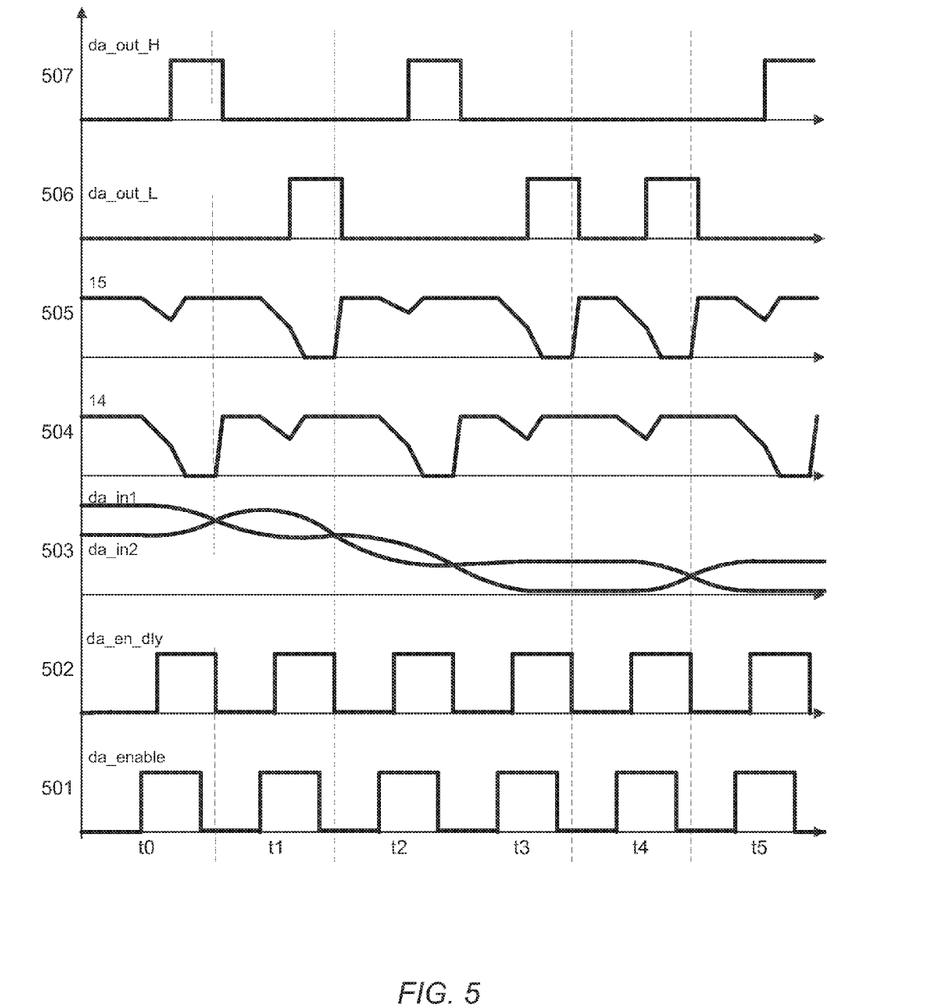
FIG. 5 illustrates possible waveforms for the differential amplifier of FIG. 3.

Turning to FIG. 5, a chart illustrating possible waveforms associated with a differential amplifier such as, e.g., differential amp 300 as illustrated in FIG. 3, as the amplifier reads a string of values from a pair of differential inputs. Referring collectively to differential amp 300 in FIG. 3 and the chart in FIG. 5, the first waveform on the bottom of the chart, 501, shows a periodic signal called da_enable. Da_enable may correspond to da_enable 320. Waveform 502 displays a delayed version of waveform 501, referred to as da_en_dly. Da_en_dly may correspond to da_en_dly 325. Waveform 503 shows an example of a possible differential pair of input signals labeled da_in1 and da_in2, which may correspond to da_in1 321 and da_in2 322. Waveform 504, labeled 14, and waveform 505, labeled 15, may correspond to signals at nodes 314 and 315.

Waveforms 506 and 507 show possible waveforms for outputs, da_out_ and da_out_H, of a differential amplifier and may correspond to da_out_ 324 and da_out_H 323, respectively.

Referring to time period t0, the differential amplifier begins the period disabled, with input da_in1 is greater than da_in2 and with a higher common mode input voltage. When da_enable asserts near the middle of the period, the voltage levels on both nodes 14 and 15 start to drop in response to the pre-charge transisitors (e.g., Q301 and Q303) being turned off as da_enable is asserted. Da_en_dly asserts shortly after da_enable, which may turn Q305 on and create a path to ground for Q306, Q307, Q334 and Q337. Q309 and Q311 conduct due to nodes 314 and 315 both being pre-charged to high levels. Q306 may conduct better than Q307 since the voltage level of da_in1 is higher than that of da_in2, resulting in node 314 being pulled to ground before node 315.

Since the common mode voltage level of the inputs is high, Q332 and Q335 may not conduct as well as Q306 and Q307, making Q306 and Q307 the dominant transistors in determining the output. Nodes 314 and 315 stabilize in these states as long as da_enable is asserted and output da_out_H goes high and da_out_ goes low.

Towards the end of period t0, da_enable de-asserts, disabling the differential amplifier and the pre-charge transistors to begin charging nodes 14 and 15 back high. These nodes may not reach a high voltage until the next time period begins. The differential amplifier outputs may return to low values as a result of nodes 14 and 15 charging.

Moving to time period t1, when da_enable asserts, the common mode voltage level of the inputs is about the same as in period t0, except that this time da_in2 is greater than da_in1. The process will be similar to the description for time period t0, except since da_in2 is greater than da_in1, Q307 may conduct better than Q306, resulting in da_out_ going high and da_out_H going low. Once again, da_enable may de-assert near the end of the time period and the pre-charging for the next time period may start. The differential amplifier outputs may again return to low values as nodes 14 and 15 charge.

In time period t2, the common mode voltage level of the input signals may be close to the middle of the input voltage range (e.g., one half of the operating voltage) lower than in time periods t0 and t1. The lower common mode input levels may be due to a change in the source of the input signals, a change in the power supply of the system, electro-magnetic noise in the system, or other reasons. In FIG. 5, the change in input levels is shown to occur in a couple of time periods for demonstration purposes. In various embodiments, the common mode voltage level of the inputs may change in the course of a single measurement or over the course of millions of measurements.

In time period t2, input da_in1 is greater than da_in2 again. Da_en_dly asserts shortly after da_enable, turning on Q305 and enabling a path to ground for Q306, Q307, Q334 and Q337. Q309 and Q311 will conduct due to nodes 314 and 315 both being pre-charged to high levels with Q306 conducting better than Q307 since the voltage level of da_in1 is higher than that of da_in2, resulting in node 314 being pulled to ground before node 315. Since the common mode voltage level of the inputs is in the middle of the input voltage range, Q332 and Q335 may conduct at a level similar to Q306 and Q307, such that the n-channel transistors, Q306 and Q307, and the p-channel transistors, Q332 and Q335, all contribute to determining the output. In some embodiments, with contributions from both the p-channel and n-channel transistors, differential amp 300 may resolve quicker than differential amp 200 that only has n-channel transistors to act on nodes 214 and 215. Nodes 314 and 315 stabilize in their states as long as da_enable is asserted and output da_out_H goes high and da_out_goes low.

Towards the end of period t2, da_enable again de-asserts. The differential amplifier may be disabled and the pre-charge transistors start charging nodes 14 and 15. The differential amplifier outputs may again return to low values as a result of nodes 14 and 15 charging.

Turning to time period t3, the common mode voltage level of the inputs is has fallen close to ground. This time da_in2 is greater than da_in1. As described above, the lower common mode input levels may be due to a variety of reasons. The n-channel transistors, Q306 and Q307, like Q206 and Q207 in differential amp 200, may not receive high enough voltage levels to turn on to sufficiently conduct. However, p-channel transistors Q332 and Q335 may respond to the lower input voltage levels and conduct sufficiently. When Q331 turns on with the assertion of da_enable, Q333 and Q336 conduct and pull transistors Q334 and Q337, respectively, towards ground. However, Q332 and Q335 pull Q334 and Q337, respectively, towards the operating voltage. Since da_in1 is less than da_in2, Q335 pulls Q337 to a higher voltage level than Q332 pulls Q334. Therefore, when Q305 turns on with the assertion of da_en_dly, Q337 is more conductive and pulls node 317 and consequently node 315 low faster than Q334 pulls nodes 316 and 314 low. As a result, Q308 starts to turn on and Q309 starts to turn off, allowing node 314 to be pulled back high and node 315 to be pulled low. The outputs of differential amp 300 may resolve correctly with da_out_L going high and da_out_H remaining low. Differential amp 300 disables and resets with the de-assertion of da_enable at the end of the period.

In time period t4, the input voltage levels remain the same as in time period t3. Differential amp 300 may behave the same as in t3.

In time period t5, the common mode input voltage level may remain low, but now da_in1 is greater than da_in2. The behavior of differential amp 300 may be similar to its behavior during time period t3 with the following exceptions. Since da_in1 is greater than da_in2, Q332 pulls Q334 to a higher voltage level than Q335 pulls Q337.

Therefore, when Q305 turns on with the assertion of da_en_dly, Q334 is more conductive and pulls node 316 and consequently node 314 low faster than Q337 pulls nodes 317 and 315 low. Q310 starts to turn on and Q311 starts to turn off, allowing node 315 to be pulled back high and node 314 to be pulled low. The outputs of differential amp 300 may resolve correctly with da_out_H going high and da_out_L remaining low.

It is noted that FIG. 5 is merely an example of waveforms that may result from the operation of one or more of the disclosed embodiments. The waveforms have been simplified for demonstrative purposes. Actual waveforms may differ due to components used to implement the disclosed circuits, environmental electro-magnetic noise, power supplies used, etc. Use of alternate circuit embodiments may also result in variations to the waveforms presented in FIG. 5.

Methods for Differential Amplifier Operation

Figure 6:
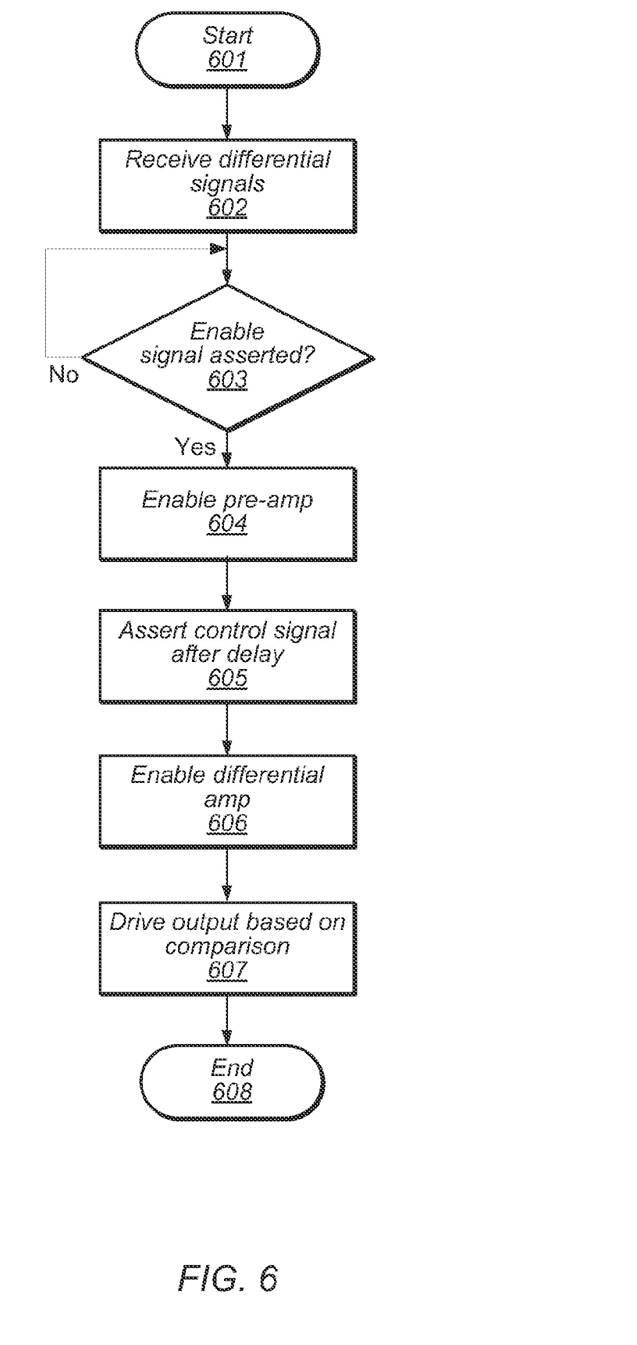
FIG. 6 depicts a flowchart of an embodiment of a method for operating a differential amplifier.

Turning to FIG. 6, a flowchart depicting an embodiment of a method for operating a differential amplifier is illustrated. The differential amplifier may, in some embodiments, include pre-amp circuits coupled to the inputs, such as, e.g., differential amp 300 as illustrated in FIG. 3. Referring collectively to SoC 100 in FIG. 1, differential amp 300 in FIG. 3, and the flowchart of FIG. 6, the method may begin in block 601.

Differential amp 300 may receive a pair of input signals, such as, for example, da_in1 321 and da_in2 322 (block 602). The pair of signals may come from a memory, such as, e.g., an SRAM within memory 102, in which one signal is a reference voltage and the other is a bit value from a cell within the SRAM. In some embodiments, the pair of signals may come from a memory interface which may also be included in memory 102. In other embodiments, the signals may originate in a transmitter for a high-speed serial interface that may be included in bus 107. In such an embodiment, the signals may be a differential signal pair in which a first signal may be a voltage level representing a bit value and the other signal may be the compliment of the first signal.

The method may then depend upon the state of an enable signal, such as, for example, da_enable 320 (block 603). If da_enable 320 is asserted, then the method may continue by enabling pre-amp circuits. Otherwise, the method may continue in an inactive state, awaiting to be enabled (block 603).

The received input signal pair may be received by a respective pair of pre-amp circuits. The pre-amps may adjust the voltage level of one or both input signals (block 604). In some embodiments, the level of adjustment performed by the pre-amp circuits may depend on initial voltage levels on the input signals. For example, initial voltage levels that are low may be adjusted to a greater extent that initial voltage levels that are closer to the level of the power supply. The adjustments may include increasing the voltage level of the input or decreasing the voltage level of the inputs. In some embodiments, the adjustments may include increasing a difference in the voltage levels between the two input signals.

In response to da_enable 320 asserting, a delayed version of this signal, da_en_dly 325, may be asserted after a delay (block 605). Da_en_dly 325 may, in some embodiments, be implemented by inputting da_enable 320 into one or more buffer circuits or inverter circuits arranged in series, such that the output is delayed from the input. In other embodiments, any other suitable delay circuit may be employed. Da_en_dly 325 may be used to enable the main comparison circuit (sometimes referred to as the center stack) of differential amp 300. Delaying the center stack of differential amp 300 after the pre-amps have been enabled allows time for the pre-amps to adjust the voltage levels of the received inputs.

In response to da_en_dly 325 asserting, the center stack of differential amp 300 may be enabled, allowing the circuits to compare the input signals da_in1 321 and da_in2 322 (block 606). If the common mode voltage level of the input signals is higher (i.e., closer to the operating voltage than to ground), then the n-channel transistors (Q306 and Q307) may have more control in determining the output of differential amp 300. If the common mode voltage level of the input signals is lower (i.e., closer to ground than to the operating voltage), the p-channel transistors (Q332 and Q335) may have more control in determining the output of differential amp 300. In some cases, where common mode voltage level of the input signals is in the middle, between ground and the operating voltage, both the n-channel and p-channel transistors may contribute to determining the output values.

The output of differential amp 300 may be driven based on the voltage levels of inputs da_in1 321 and da_in2 322 (block 607). If the voltage level of da_in1 321 is greater than the voltage level of da_in2 322, then da_out_H 323 may transition high and da_out_may remain low. Conversely, if the voltage level on da_in1 321 is less than the voltage level on da_in2 322, then da_out_H 323 may remain at a low level and da_out_may transition to a high level.

It is noted that the method illustrated in FIG. 6 depicts operations being performed in a sequential fashion. In various other embodiments, one or more of the operations may be performed in parallel or in a different sequence.

Figure 7:
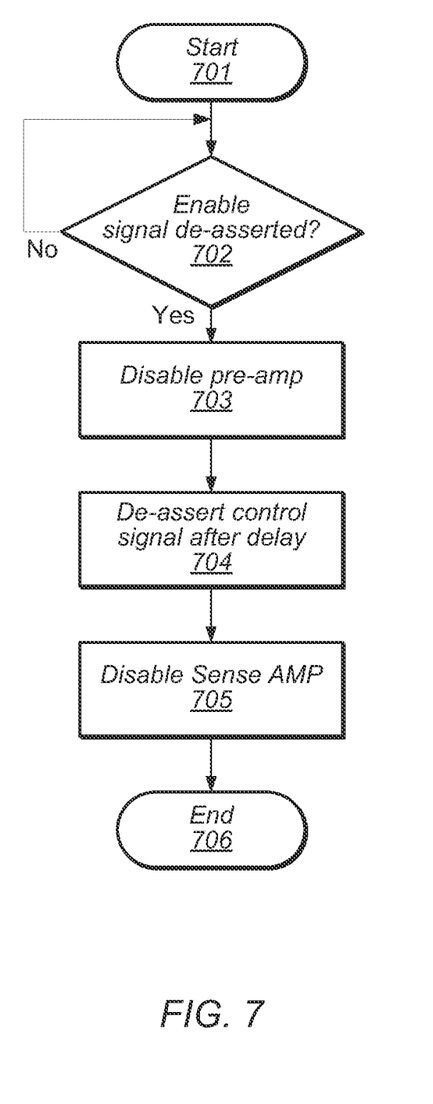
FIG. 7 depicts a flowchart of an embodiment of a method for disabling a differential amplifier.

Moving now to FIG. 7, a flowchart depicting an embodiment of a method for disabling a differential amplifier that includes pre-amp circuits, such as, e.g., differential amp 300 in FIG. 3 is illustrated. Referring collectively to differential amp 300 in FIG. 3, and the flowchart of FIG. 7, the method may begin in block 701.

The method may then depend on the state of an enable signal, such as da_enable 320 (block 702). If da_enable 320 is asserted, then the method may remain in block 602. When da_enable 320 has been de-asserted, pre-amp circuits of differential amp 300 may be disabled (block 703).

In some embodiments, the pre-amps of differential amp 300 may be disabled by turning off transistor Q331. By turning off Q331, a path to ground for transistors Q333 and Q336 may be switched off. If Q333 and Q336 cannot conduct current, then the pre-amps may consume little to no power while da_enable 320 is low. In addition to disabling the pre-amps, de-asserting da_enable 320 may turn on transistors Q301-Q304 which may begin to pre-charge nodes 314-317 for the next measurement.

In response to da_enable 320 being de-asserted, the delayed version of this signal, da_en_dly 325, may be de-asserted after a brief delay (block 704). As described above in reference to block 505, da_en_dly 325 may be implemented by use of buffer circuits or inverter circuits arranged in series or any other suitable delay circuits.

De-asserting da_en_dly 325 may, in various embodiments, turn transistor Q305 off, which may in turn disable the center stack of differential amplifier 300 (block 705). By turning Q305 off, current may not flow through transistors Q306, Q307, Q334, and Q337 if nodes 316 and 317 are at equivalent voltage levels. Once nodes 314-317 have been pre-charged, differential amp 300 may, in some embodiments, consume little to no significant power. The method may end in block 706.

It is noted that the method illustrated in FIG. 7 depicts operations being performed in a sequential fashion. In various other embodiments, other operations may be performed in parallel or in a different sequence. Other embodiments may include fewer or additional steps not shown in FIG. 7.

Numerous variations and modifications will become apparent to those skilled in the art once the above disclosure is fully appreciated. It is intended that the following claims be interpreted to embrace all such variations and modifications.

What is claimed is:

1. An apparatus, comprising:
   a pre-amp circuit configured to:
      receive a first input signal and a second input signal;
      receive a first enable signal;
      adjust a voltage level of the first input signal and a voltage level of the second input signal in response to an assertion of the first enable signal; and
      assert a second enable signal after a pre-determined period of time from the assertion of the first enable signal; and
   a differential amplifier configured to:
      receive the second enable signal;
      amplify a voltage difference between the first input signal and the second input signal dependent upon the adjusted voltage level of the first input signal and the adjusted voltage level of the second input signal in response to the assertion of the second enable signal; and
      generate at least one output signal dependent upon the amplified voltage difference.

2. The apparatus of claim 1, further comprising an inverting output stage, wherein the inverting output stage is configured to invert a logical polarity of the at least one output signal.

3. The apparatus of claim 1, wherein the second input signal is complementary to the first input signal.

4. The apparatus of claim 1, wherein the pre-amp circuit includes a first pull-up device coupled to the first input signal and a second pull-up device coupled to the second input signal.

5. The apparatus of claim 4, wherein the first pull-up device is controlled by the second input signal and the second pull-up device is controlled by the first input signal.

6. The apparatus of claim 4, wherein the pre-amp circuit is further configured to disable the first pull-up device and the second pull-up device responsive to a de-assertion of the first enable signal.

7. The apparatus of claim 6, wherein to disable the first pull-up device and the second pull-up device, the pre-amp circuit is further configured to reduce a current flow through the first pull-up device and the second pull-up device.

8. A method, comprising:
   receiving a first input signal and a second input signal;
   receiving a first enable signal;
   adjusting a voltage level of the first input signal and a voltage level of the second input signal in response to an assertion of the first enable signal;
   asserting a second enable signal after a pre-determined period of time has elapsed from the assertion of the first enable signal;
   amplifying a voltage difference between the first input signal and the second input signal dependent upon the adjusted voltage level of the first input signal and the adjusted voltage level of the second input signal in response to the assertion of the second enable signal; and
   generating at least one output signal dependent upon the amplified voltage difference between the first input signal and the second input signal.

9. The method of claim 8, wherein generating the at least one output signal comprises generating a first output signal and a second output signal, wherein the first output signal is dependent upon the voltage difference of the second input signal subtracted from the first input signal and the second output signal is dependent upon the voltage difference of the first input signal subtracted from the second input signal.

10. The method of claim 8, wherein the second input signal is complementary to the first input signal.

11. The method of claim 10, wherein adjusting the voltage level of the first input signal and the second input signal comprises adjusting a current through a first pull-up device coupled to the first input signal dependent upon the second input signal.

12. The method of claim 11, wherein adjusting the voltage level of the first input signal and the second input signal comprises controlling, by the first input signal, a second pull-up device coupled to the second input signal.

13. The method of claim 12, further comprising disabling the first pull-up device and the second pull-up device in response to a de-assertion of the first enable signal.

14. A system, comprising:
   a first functional block configured to transmit data via a communication bus, wherein the communication bus includes a differential signal pair, wherein the differential signal pair includes a first signal and a second signal; and
   a second functional block coupled to the communication bus, wherein the second functional block is configured to:

receive the first signal and the second signal;

receive a first enable signal;

adjust a voltage level of the first signal and a voltage level of the second signal in response to an assertion of the first enable signal;

assert a second enable signal after a pre-determined period of time from the assertion of the first enable signal;

amplify a voltage difference between the first signal and the second signal dependent upon the adjusted voltage level of the first signal and the adjusted voltage level of the second signal in response to the assertion of the second enable signal; and generate at least one output signal dependent upon the amplified voltage difference between the first signal and the second signal.

15. The system of claim 14, wherein to adjust the voltage level of the first signal and the voltage level of the second signal, the second functional block is further configured to adjust a first current through a first pull-up device coupled to the first signal and adjust a second current through a second pull-up device coupled to the second signal.

16. The system of claim 15, wherein the first pull-up device is configured to selectively couple the first signal to a power supply signal dependent upon the second signal, and wherein the second pull-up device is configured to selectively couple the second signal to the power supply signal dependent upon the first signal.

17. The system of claim 15, wherein the second functional block is further configured to disable the first pull-up device and the second pull-up device responsive to a de-assertion of the first enable signal.

18. The system of claim 17, wherein to disable the pull-up devices, the second functional block is further configured to reduce current flow through the first pull-up device and the second pull-up device.

19. The system of claim 14, wherein to generate the at least one output signal, the second functional block is further configured to generate a first output signal and a second output signal, wherein the first output signal is dependent upon the voltage difference of the second signal subtracted from the first signal and the second output signal is dependent upon the voltage difference of the first signal subtracted from the second signal.

20. The system of claim 19, wherein the second functional block is further configured to invert a logical polarity the first output signal and the second output signal.

\* \* \* \* \*